United States Patent [19]

Anderson et al.

[11] Patent Number: 4,610,084
[45] Date of Patent: Sep. 9, 1986

[54] METHOD AND APPARATUS FOR INSERTING LEADS INTO HOLES IN SUBSTRATES

[75] Inventors: Carl R. Anderson, Arvada; Gary G. Seaman, Broomfield, both of Colo.

[73] Assignee: AT&T Technologies, Inc., Berkeley Heights, N.J.

[21] Appl. No.: 612,170

[22] Filed: May 21, 1984

[51] Int. Cl.[4] .......................... H05K 3/30; B23P 19/00
[52] U.S. Cl. ........................................ 29/834; 29/741; 414/730; 901/6; 901/45; 901/46
[58] Field of Search ................. 29/834, 928, 739, 741; 269/73; 414/730; 901/6, 45, 46

[56] References Cited

U.S. PATENT DOCUMENTS

| | | |
|---|---|---|
| 3,241,222 | 3/1966 | Timmermans . |
| 3,736,651 | 6/1973 | Law et al. ........................ 29/739 X |
| 3,779,291 | 12/1973 | Yeo . |
| 3,812,569 | 5/1974 | Kufner et al. . |
| 4,051,593 | 10/1977 | Mori et al. . |
| 4,089,105 | 5/1978 | Yeo et al. ........................ 29/739 X |
| 4,204,319 | 5/1980 | Bishop ............................ 29/739 |
| 4,329,776 | 5/1982 | Mori et al. . |
| 4,472,668 | 9/1984 | Mutschler et al. .............. 414/730 X |

OTHER PUBLICATIONS

Western Electric Tech. Dig. No. 60, Oct. 1980, p. 9, by Edwards.

Primary Examiner—Mark Rosenbaum
Assistant Examiner—Carl J. Arbes
Attorney, Agent, or Firm—R. F. Kip, Jr.

[57] ABSTRACT

Apparatus and methods for inserting leads of an electric circuit component into correspondingly arranged holes in a printed wiring board by (a) holding the component by a robotic arm adjacent the board so that its leads contact the board under pressure and are in nominal registration in the X and Y directions, and (b) subjecting the board to the combined effect of two vibrating motions which are respectively directed in these two directions, and of which one is superimposed on the other. These two motions are each controlled in frequency and amplitude and differ from each other in a motion characteristic whereby the leads sweep in two-dimensional patterns over board areas respective to their corresponding holes and centrally including them until the leads substantially exactly register with the holes to become inserted therein by the pressure on the leads.

2 Claims, 8 Drawing Figures

METHOD AND APPARATUS FOR INSERTING LEADS INTO HOLES IN SUBSTRATES

TECHNICAL FIELD

The present invention relates to the production of parts, and more particularly to methods and apparatus for inserting one or more leads in one or more holes in a substrate to the end of forming such parts.

BACKGROUND OF THE INVENTION

The production of parts constituting electrical and electronic circuit boards often requires the mounting of several multilead electrical components on each board. Usually, such mounting techniques involve manual insertion of the leads of each multilead component in corresponding holes of a circuit board. Clearly, such techniques result in small throughput, are time consuming and labor intensive. Moreover, with electrical components, such as semiconductor integrated circuit (I.C.) packages, becoming smaller in size, and with the number of leads on each I.C. package substantially increasing to achieve higher packaging densities, the problem of operator fatigue becomes a major one.

Several attempts have been made to avoid the foregoing hindrances of manual insertion of multilead components by resorting to automation. In the area of automatically mounting multilead components or I.C. packages on printed wiring boards (PWB), the emphasis so far has been on achieving high accuracies in the positioning of a robotic hand or automatic manipulator with respect to the holes of the PWB. Such high accuracies and close tolerances in the design and control of the robotic hand result in a complex and expensive automatic apparatus for accurately positioning the leads or terminals with respect to their corresponding holes. Also, the foregoing strict hand positioning requirements do not and cannot compensate for any measurement deviations existing between the outer housing of the component to be inserted and its leads.

In a copending U.S. patent application Ser. No. 382,263 filed May 26, 1982 in the name of B. D Hoffman and B. Weismann for "Method and Apparatus for Automatically Mounting Multilead Components on Circuit Boards", and assigned to the assignee hereof and incorporated herein by this reference, there is disclosed a method for mounting a multilead component on a circuit board comprising the steps of positioning the multilead component on the board such that each lead of the component is proximate to a corresponding aperture in the board, and imparting a vibratory motion to the board to the end of realizing insertion of the leads of the component into the corresponding apertures in the board. Such vibratory motion is, however, disclosed as, in one way, being accomplished in the disclosed embodiment by mounting the board at three of its corners to a base through mounting bodies at those corners, and by imparting vibration to the board by means of a single motor mounted on the base and driving an eccentric shaft coupled to the fourth corner of the board.

SUMMARY OF THE INVENTION

In contrast to the foregoing, we have developed improved methods and apparatus for inserting one or more leads into one or more corresponding holes in a substrate, and in accordance with which such insertion is realized as follows. The lead is held adjacent to the substrate to contact the substrate under pressure and to be nominally positioned to register with its corresponding hole in each of two directions parallel to the board and transverse to each other. Motive means is employed to produce between the board and lead a first relative vibratory motion in a first of such directions, and, also a second relative vibratory motion taking place in other of such directions and superposed with and differing in frequency from the first vibratory motion. Such superposition and such difference is effective to produce, by the two motions in combination, a sweeping of the lead in a two-dimensional pattern over an area of the substrate including the hole corresponding to the lead. The described sweeping of such lead in such pattern over such area normally culminates in a substantially exact registration of the lead with its corresponding hole. Upon such registration occuring, the lead is inserted under the mentioned pressure into such hole.

BRIEF DESCRIPTION OF DRAWINGS

For a better understanding of the invention, reference is made to the following description of exemplary embodiments thereof, and to the accompanying drawings wherein.

DETAILED DESCRIPTION OF EMBODIMENTS

Figure 1:
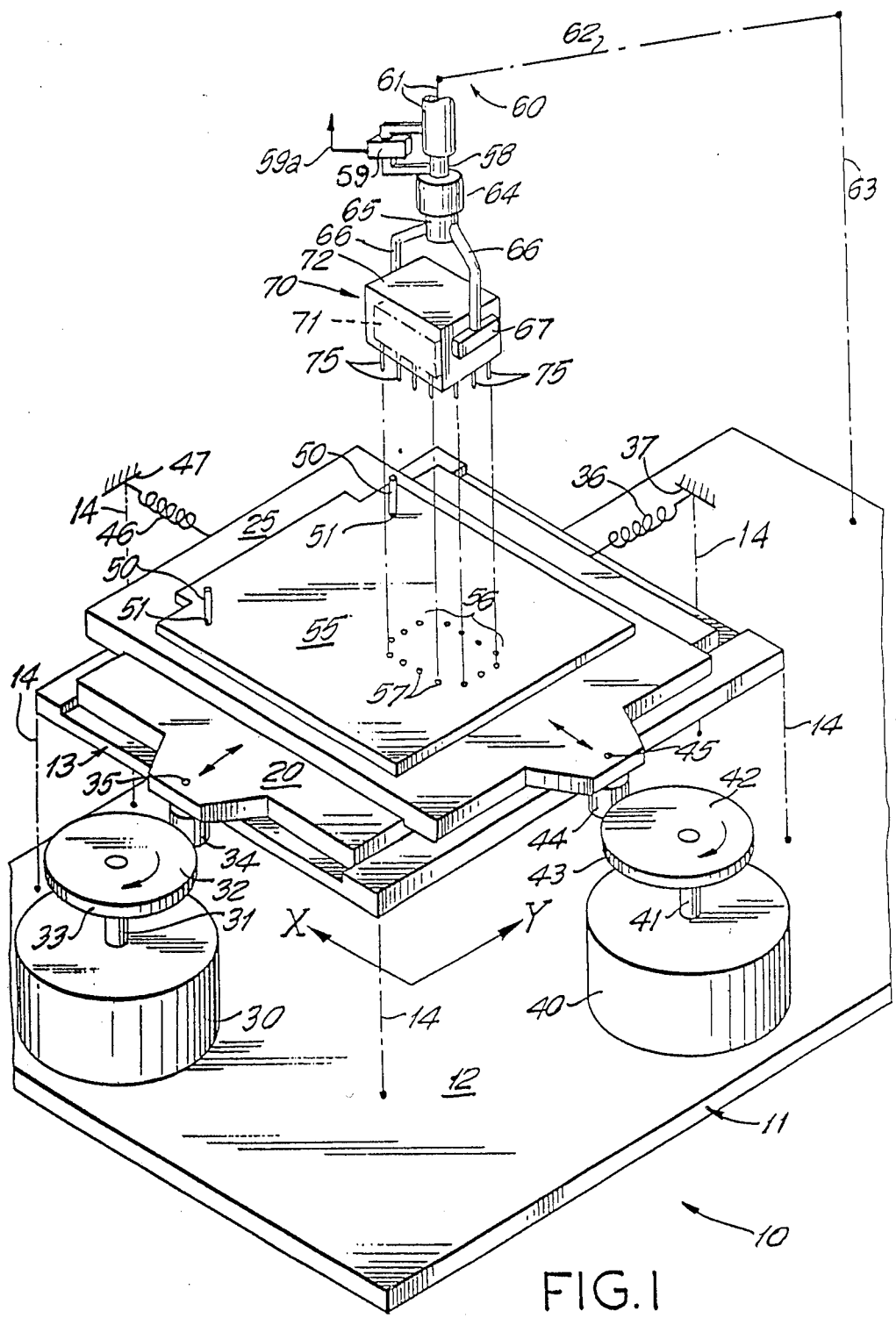
FIG. 1 is a schematic isometric view of a first apparatus embodiment of the invention.

Referring now to FIG. 1, reference numeral 10 designates lead insertion apparatus comprising a stationary frame or base 11 of which a part is a bottom plate 12 fixedly attachable to a floor of the manufacturing facility in which the apparatus is located. Apparatus 10 consists in part of a vibratory unit comprising a slide bed 13 fixedly secured to plate 12 by support structure symbolically represented in FIG. 1 by dot-dash lines 14.

Bed 13 supports a first carriage in the form of a slide table 20 guidedly mounted on the bed by ways or the like to be bidirectionally movable relative to the bed in a first path fixedly in alignment with a first direction which is a reference coordinate for apparatus 10 and is referred to herein as the "Y" direction. Slide table 20 is constrained by its mounting on bed 13 to be movable only in the Y direction.

Slide table 20 in turn supports thereon a second carriage in the form of a slide table 25 guidedly mounted on carriage 20 to be bidirectionally movable relative thereto in a second path fixedly in alignment with a second direction which is another reference coordinate direction for apparatus 10 and is referred to herein as the "X", direction. Such X direction is transverse to the Y direction and is preferably normal (i.e., orthogonal) thereto. Slide table 25 is constrained by its mounting on slide table 20 (and the mounting of the latter on bed 13) to be movable only in the X direction. Both the X and the Y directions lie in the horizontal plane.

Mounted beneath the front end of table 20 on base 11 is an adjustable speed d.c. motor 30 having a vertical shaft 31 on the top of which is a circular disc or cam 32 fixedly rotatable with shaft 31 and eccentrically mounted with respect thereto. Disposed adjacent the circular cylindrical circumferential surface 33 of cam 32 is a cam follower in the form of a circular cylindrical roller 34 concentrically eccentrically mounted on a vertical pin shaft 35 secured at its top to the front end of table 20 to extend downward therefrom. Roller 34 is maintained in continuous contact with cam surface 33 by a biasing of table 20 towards the cam 32 by biasing means 36 in the form, say, of a compression spring interposed between the rear end of table 20 and a spring backing structure 37 fixed in relation to base 11. Elements 31–37 constitute a motion transmitting means for imparting vibratory motion to table 20.

Table 25 is similarly provided with motive means comprising an adjustable speed d.c. motor 40 mounted on base 14 beneath the right hand end of that table and having a vertical shaft 41 on the top of which is a circular disc or cam 42 eccentrically mounted on shaft 41 and the circular cylindrical circumferential surface 43 of which is disposed adjacent a cam follower in the form of circular cylindrical roller 44 concentrically mounted on a vertical pin shaft 45, the top of which is secured to the right hand end of that table. Roller 44 is maintained in continuous contact with cam surface 43 by a biasing of table 25 toward cam 42 by biasing means in the form, say, of a compression spring 46 interposed between the left hand end of table 25 and spring backing structure 47 fixed in relation to base 11.

Table 25 has thereon a pair of upwardly projecting locating pins 50 adapted to be received with a close fit in corresponding location holes 51 formed in printed wiring boards fed to that table from a conveyor line. One of such boards 55 is illustrated in FIG. 1. As shown, board 55 is mounted by table 25 to lie horizontally in a plane defined by the X and Y directions, pins 50 being received in the board's holes 51 so that the board is referenced in both such directions in its positioning with respect to table 25. Table 25 is referenced in its positioning in the Y direction relative to table 20 by virtue of being immovable in that direction ralative to table 20, and table 25 is also referencable in its positioning in the X direction relative to table 20 by an indexing of shaft 41 to a reference angular position. Table 20 in turn is referenced in its positioning in the "X" direction relative to bed 13 by virtue of being unmovable in that direction relative to such bed, and table 20 is referencable in its positioning in the Y direction relative to bed 13 by indexing of shaft 31 to a reference angular position. Bed 13 is, as earlier stated fixed in its positioning relative to base 11 in both of the "X" and "Y" directions. It follows that board 55 is referencable in its positioning relative to base 11 in each of the X and Y directions.

Board 55 has formed therein a plurality of separate patterns of holes of which each pattern corresponds to a respective one of a plurality of multilead electric circuit components to be mounted on board 55. One such pattern 56 of holes 57 is shown in FIG. 1, such pattern being referenced in the X and Y directions in its positioning on board 55.

In addition to the above-described vibratory unit, apparatus 10 includes a component handling unit of which a principal part is a program-controlled robotic manipulator means comprising a robotic arm 60. Arm 60 comprises a plurality of serially connected articulated arm members 61, 62, 63 (symbolically represented in FIG. 1 by dot-dash lines) of which member 63 is coupled at its unarticulated end to base 11 to be rotatable in relation to the base. The lower end of arm 61 is hollow and contains within its hollow a vertical arm extension or slide 58 rotatably fixed with arm 61 but axially slidable up and down with respect thereto. Slide 58 can either be held in a retracted position in arm 61 by, say actuation of a solenoid (not shown) in the arm or, alternatively, the slide can be released by de-actuation of the solenoid so that the slide is free to move downward. Downward movement of slide 58 by a predetermined amount in relation to arm 61 is detected by a microswitch 59 having contacts coupled to slide 58 and arm 61, respectively, and adapted to close with each other when such predetmined amount of movement takes place.

Slide 58 is coupled at its free end to a wrist 64 having compliance. Wrist 64 is in turn coupled to a hand 65 from which there extends a pair of spread fingers 66 terminating in respective gripping jaws 67 (only one shown) in FIG. 1. Jaws 67 are illustrated as gripping between them a multilead electric circuit component 70. Hand 65 includes conventional means for selectively changing the force exerted on component 70 by jaws 67 so that the component is either held firmly or with sufficient looseness that it will separate from jaws 67.

Component 70 comprises an integrated current device 71 encapsulated in a casing 72 and having a plurality of electrical leads 75 extending vertically downward from the device. As used in the specification and claims hereof, the term "lead" means not only an electrical lead but also any other elongated element similar in mechanical behavior to an electrical lead. Leads 75 are mutually arranged to form in the horizontal plane a pattern the same as the pattern 56 of holes 57 in board 55. By virtue of the facts that (a) component 70 in being picked up under program control by jaws 67 is referenced in the course of such picking up in the "X" and "Y" directions in its positioning relative to these jaws, (b) jaws 67 are referenceable in their positioning relative to base 11 by virtue of the coupling of arm 60 to that base, and (c) board 55 and the pattern 56 thereon are as earlier described, also referenceable in positioning relative to base 11, the leads 75 of component 70 are referenceable in their X and Y positioning relative to the corresponding holes 57 in board 55. It follows that such leads may, by appropriate movements under program control of arm 60, be brought into a registration with such holes which is nominal rather than substantially exact in that such registration is statistically within some precalculated range in both the X and Y directions of being exact but is normally not sufficiently good that all leads can be inserted into their holes by mere downward movement of component 70.

Figure 2:
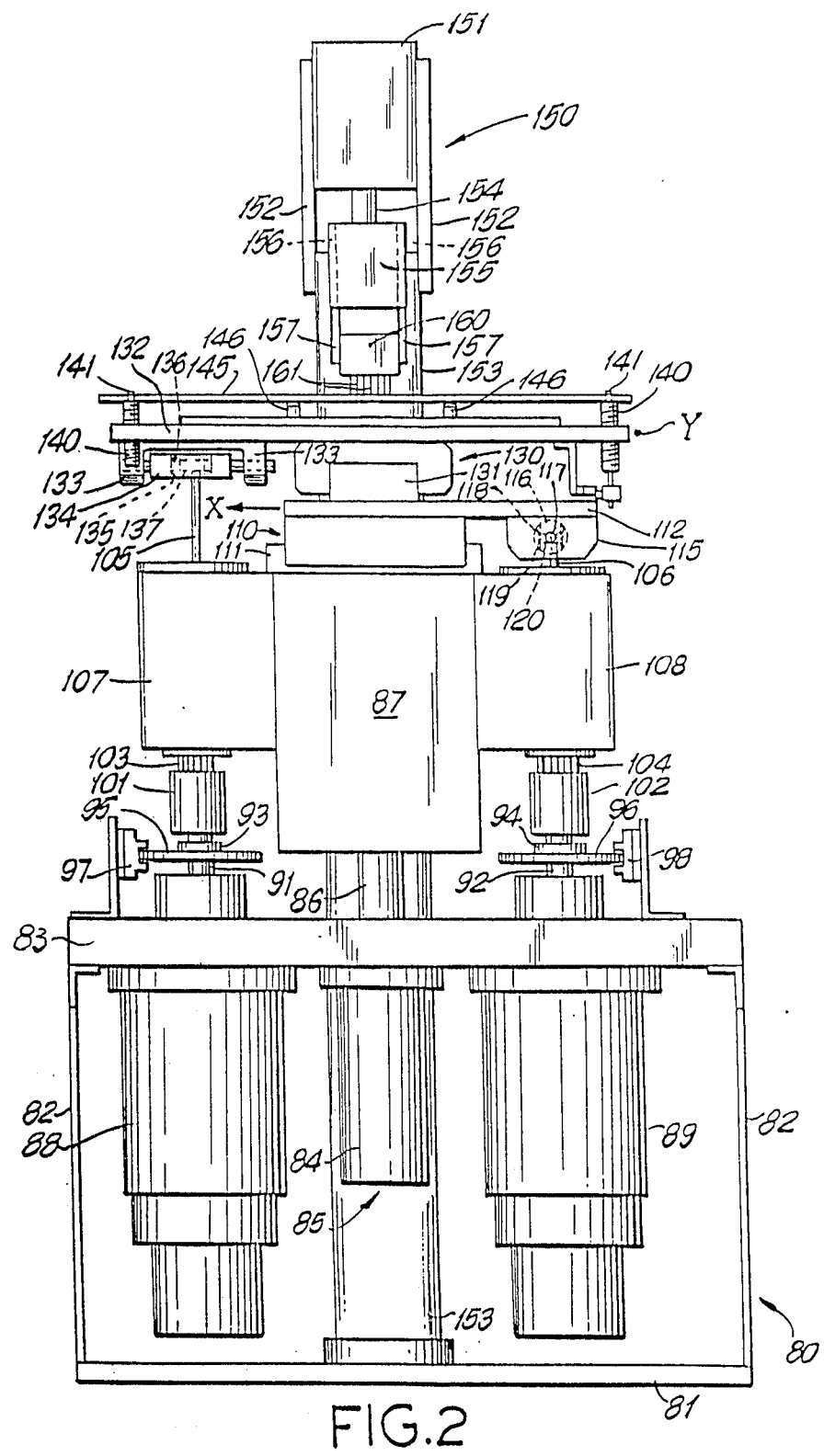
FIG. 2 is a first elevation of a second apparatus embodiment of the invention.
Figure 3:
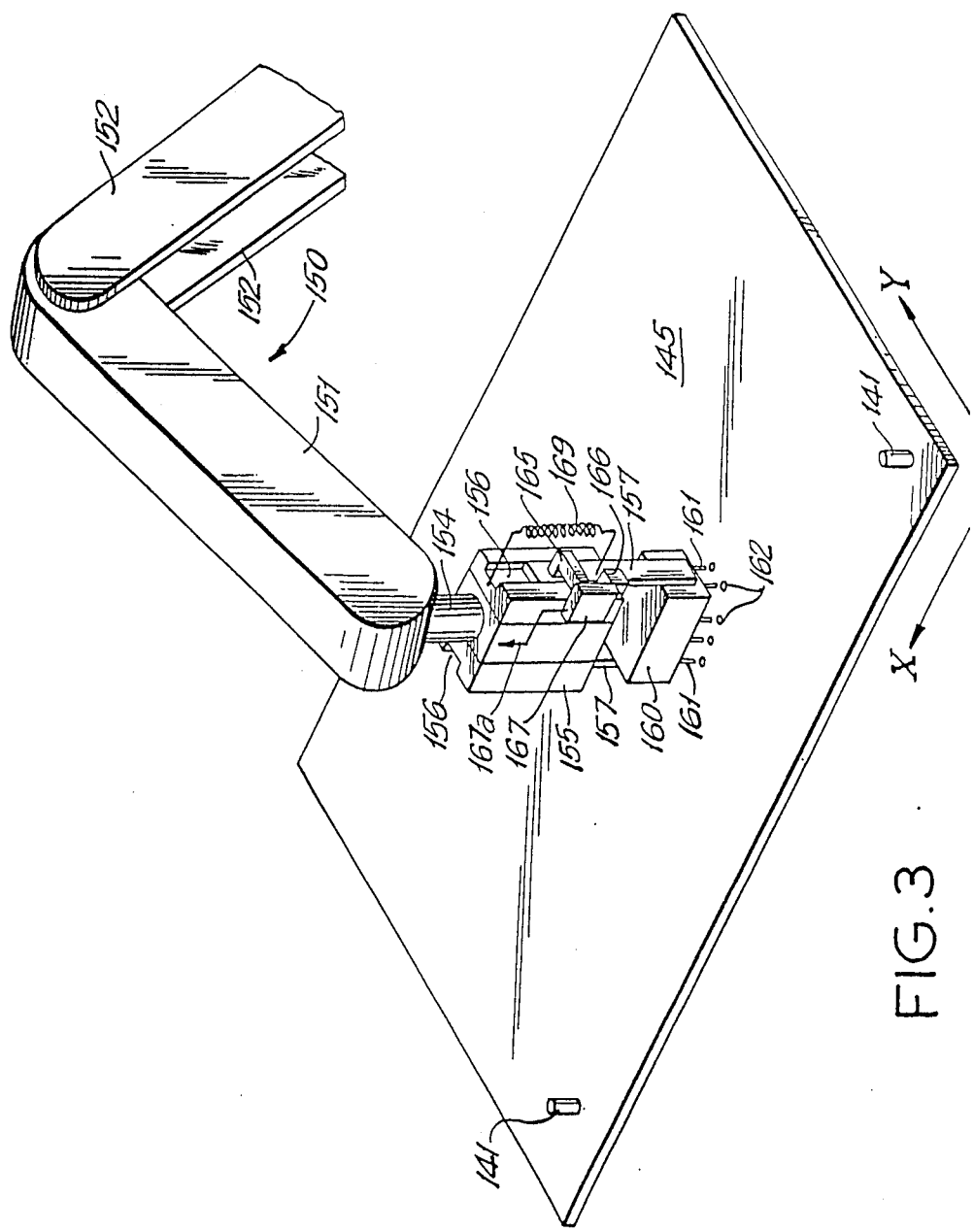
FIG. 3 is an isometric view showing details of the robotic manipulator means of the FIG. 2 embodiment, and of a multilead component and printed wiring board with which such embodiment is used.

The embodiment of FIGS. 2 and 3 is conceptually similar in respects to the FIG. 1 embodiment. FIG. 2 shows an insertion apparatus 80 comprising a base 81 rigidly coupled by side frames 82 to a higher cross plate 83. Centrally mounted on the underside of cross plate 83 is the air cylinder 84 of a pneumatic drive 85 of which the piston 86 passes through an aperture in plate 83 to attach to the underside of an elevator block 87. Also mounted beneath plate 83 (on opposite sides of cylinder 84) are first and second adjustable speed d.c. drive motors 88 and 89 fastened by circumferential flanges thereon to the bottom of plate 83 and having forward parts of the motors projecting upward though apertures in plate 83 such that the motor shafts 91 and 92 are positioned above that plate at the point where these shafts emerge from the housings of the motors. Motor shafts 91 and 92 are encircled by respective collars 93, 94 fixedly rotatable with the shafts and having integral therewith a pair of respective annular indicating discs 95, 96 each having one notch (not shown) cut into the periphery therof. The peripheries of discs 95, 96 are positioned within gaps formed in respective sensors 97 and 98 each having a light source and a photodetector disposed on opposite side of its gap so that the passage of light from the source to the photodetector is interrupted by the associated disc except when its peripheral notch is disposed within the gap. Whenever that event occurs, the sensor produces a signal output which can be used in two different ways. If the associated motor is unenergized, the output can be used as an indicator for indexing the angular positioning of the motor's shaft to a desired reference angular position. On the other hand, if the associated motor is running, the output will be a series of pulses with a pulse rate proportional to the speed of revolution of the motor. Such pulse series can be fed to a pulse rate counter to provide an indication of the motor's speed. Alternatively, that series of pulses can be fed to a pulse comparator also receiving a series of pulses from a pulse generator producing such pulses at an accurately adjustable rate, the pulse comparator producing an error signal proportional to the difference in pulse rate of the two series of pulses received thereby. Such error signal can then be fed to a conventional servosystem supplying the energy for running the motor such that the servosystem accurately maintains the motor's speed at a value determined by the value set on the pulse generator for the rate of the pulses produced thereby.

Mounted on the tops of motor shafts 91 and 92 to fixedly rotate therewith are a pair of respective spline collars 101 and 102 having received therein spline gears 103, 104 fixedly mounted on the bottoms of a pair of vertical cam drive shafts 105, 106 passing upward through bushings 107, 108 fixedly attached to elevator block 87. Those bushings each contain upper and lower thrust bearings(not shown) by which shafts 105, and 106 are freely rotatabale within the brushing but are axially fixed in position relative thereto. The spline collars 101, 102 and spline gears 103, 104 provide couplings between motor shafts 91, 92 and drive shafts 105, 106 whereby the latter are adapted to rotate in fixed relation with the former but nonetheless shafts 105, 106 may be axially moved up and down relative to axially stationary shafts 91, 92 in the course of rotation of the shafts. Accordingly block 87 and the entire assembly supported thereby may be vertically shifted by pneumatic device 85 without interrupting the driving of shafts 105, 106 by motors 88, 89.

Elevator block 87 is as stated, axially movable up and down by pneumatic device 85 but is constrained by conventional guide means (not shown) from rotation about the axis of such device. Block 87 has mounted thereon a ball slide 110 comprising a way 111 and a slide table 112 bidirectionally movable on way 111 only in the direction of orientation of the way. Way 111 is fixedly mounted on block 87 and is oriented with respect thereto such that table 112 is movable only in the X direction.

Table 112 has fixedly mounted thereto, under its right hand end, two slide blocks 115 (only one shown) spaced from each other in the Y direction and having therein respective horizontal bores 116 in which are received opposite ends of a slide bar 117. Bar 117 is comprised of two cylindrical rod portions at its opposite ends and a central rectangular block portion joining such rod portions. Formed in such central portion of bar 117 is a vertical bore 118 disposed between blocks 115 and within which is fixedly seated an annular bearing 119. Bearing 119 in turn has received in it with a close, freely rotatable fit a cam disc 120 similar to the cam 42 (FIG. 1) and eccentrically mounted on the top of drive shaft 106. Rotation of shaft 106 is adapted to produce vibratory motion of slide table 112 in the X direction in a manner which will be understood from the earlier description of the FIG. 1 embodiment. In the course of such vibratory motion of slide table 112, bar 117 is adapted to freely slide back and forth in blocks 115 so that the rotation of cam 120 in bearing 119 will exert no force on table 112 in the Y direction.

Table 112 carries a ball slide 130 comprising a way 131 and slide table 132. Way 131 is fixedly mounted and oriented on slide table 112 so that table 132 is slidable only in the Y direction (i.e., normal to the plane of the driving of FIG. 2). Table 132 carries in fixed relation, under its left hand end, a pair of slide blocks 133 spaced from each other in the X direction and receiving in slide fitting relation, in respective horizontal bores therein the opposite ends of a slide bar 134. Bar 134 comprises two cylindrical rod portions at such end and a central rectangular block portion joining such rod portions. Formed in such central portion is a vertical bore 135 within which is fixedly seated an annular bearing 136 surrounding with a close freely rotatable fit a cam disc 137 eccentrically mounted in fixed relation on the top of shaft 105 and similar to the cam 32 (FIG. 1). Shaft 105 and elements 133–137 are operable in a manner self evident from the previous description to impart to slide table 132 a vibratory motion in the Y direction. As distinct from the FIG. 1 embodiment in which the X directed vibratory motion is superposed on the Y directed vibratory motion, in the FIG. 2 embodiment the converse occurs. The sliding of slide bar 134 in block 133 serves not only to isolate table 132 from X directed force from cam 137 but also to isolate that cam from the X directed vibratory motion communicated from table 112 to table 132.

Table 132 carries at its opposite ends a pair of screws 140 threadedly received in holes in the table and having at their tops respective pins 141 which are spring loaded to normally project out from the screws, but which are retractable under pressure into holes in the screws. Pins 141 are adapted to be received in location holes in printed wiring boards fed from a conveyer line to table 132. One such board 145 is shown in FIG. 2 as mounted by table 132 to lie in a horizontal plane and, as located by pins 141 to be referencable in its X-Y positioning relative to base 81. Central portions of the mounted board 145 receive support from underneath by posts 146 projecting up from table 132.

Apparatus 80 includes program controlled robotic manipulator means comprising a robotic arm 150 (FIGS. 2 and 3) having a plurality of serially connected articulated arm members 151, 152, 153 of which member 153 is coupled at its unarticulated end to base 81 to be rotatable in reltion thereto, and of which arm member 151 has at its free end a wrist 154 having compliance. Wrist 154 mounts at its front a blocklike hand 155 having formed in opposite of its sides a pair of vertical slots 156 within which are received respective bar fingers 157 slidable up and down in those slots. Fingers 157 are shown (FIGS. 2 and 3) as gripping between therein a multilead component 160 having leads 161 positioned over correspondingly arranged holes 162 formed in printed wiring board 145. Hand 155 includes conventional means for changing the gripping force of fingers 157 on component 160 so that the fingers hold it either firmly or with sufficient looseness that, if the component is not supported, it will separate from the fingers.

One of fingers 157 has mounted thereon (FIG. 3) a contact bar 165 disposed above a stop tab 166 on hand 155. Bar 165 and tab 166 bear, on their respective sides facing each other, two contacts of a microswitch 167 adapted to produce a signal output on lead 167a upon closure of those contacts. That output is used to indicate when fingers 157 have moved down a predetermined distance in relation to hand 155, and, thereupon, to initiate movement of the hand away from board 145. Fingers 157 may, if desired, be urged downward by a compression spring 16a in addition to being urged to move downward under gravity as a result of the weight of the held component 160 and parts of the robotic arm 150.

From the foregoing description of the equipment 10 of FIG. 1 and the equipment 80 of FIGS. 2 and 3, the similarities between those two equipments will be apparent, and it will be self evident that much of the description of equipment 10 is, together with the terminology, used in that description, applicable also to equipment 80. Further it will be self evident, from the description of referencing given in connection with the FIG. 1 equipment, that the board 145 and component 160 of FIGS. 2 and 3 may, in a similar manner, each be referenced in X-Y positioning relative to board 145 so that the leads 161 of that component may be brought into nominal registration with the corresponding holes 162 in board 145.

METHODS AND USE

The general operation of the FIG. 1 embodiment is as follows. With board 55 being mounted on table 25 as shown, the motor shafts 31 and 41 are indexed to referenced angular positions thereof so as to reference the positioning of board 55 in relation to a reference datum as, say, base 11. With board 55 being so referenced, and with the relative positioning on it of the patterns of holes therein being previously known, the location of hole pattern 56 in relation to base 11 may be referenced with accuracy.

Robotic manipulator 60 is actuated under program control to pick up component 70 from, say, a conveyor line, move the component to be above the board as shown in FIG. 1, and then lower component 70 until its leads 71 are positioned in nominal registration with holes 57 in board 55 and, also, contact the board under light pressure, all this being done while slide 58 is retracted in arm 61. Slide 58 then released from the arm so that the slide is free to move down, and it may do so slightly but not by the amount necessary to trigger microswitch 59. With slide 58 being released, leads 75 are urged towards board 55 under pressure produced by gravity, i.e., by the weight of component 70 itself and the weight of elements 58 and 64-67.

Motors 30 and 40 are energized to rotate shafts 31 and 41 and the eccentric cams 32 and 42 thereon. Under the bias applied to table 20 and 25 by springs 36 and 46, cam follower rollers 34 and 44 maintain contact with the camming surfaces 33 and 43 of the mentioned cams to be cylically displaced thereby in, respectively, the Y direction and the X direction. As is evident, the cylical displacements of rollers 34 and 44 will correspond to the displacements over time of the projections of selected points on the rotating cam surfaces 33 and 43 on, respectively, a plane passing through the axes of shaft 31 and roller 34, and a plane passing through the axes of shaft 41 and roller 44. The displacements of such projections in such planes will be sinusoidal or substantially so. Thus, the mentioned cylical displacements of rollers 34 and 44 are in the nature of simple harmonic displacements.

The cyclical displacements of roller 34 are communicated to table 20 to impart thereto in the Y direction a linear simple harmonic vibratory motion controlled in frequency by the speed of motor 30 and in amplitude by the eccentricity of cam 32. Similarly, the cyclical displacements of roller 44 are communicated to table 25 to impart thereto in the X direction a linear simple harmonic vibratory motion controlled in frequency by the speed of motor 40 and in amplitude by the eccentricity of cam 42. The Y vibratory movement of table 20 is communicated through table 25 to roller 44 to produce a shifting thereof in the Y direction relative to cam 42, but such shifting has no significant effect on the vibratory motion of table 25. That X vibrating motion is superposed on the Y vibratory motion of table 20. Also, the X vibratory motion differs from the Y vibratory motion by a motion characteristic which may conveniently be a frequency difference but also may be a changing phase difference. In such connection, it is known that a progressively changing difference in phase between two motions is correspondent to a difference in frequency between them.

The result of that superposition and of that difference is that, as later described in more detail, the two separate vibratory motions cooperate to vibrate board 55 so that each of the leads 75 sweeps in a two-dimensional pattern over an area respective to the hole 57 corresponding to that lead and centrally including such hole until such sweeping brings those leads into substantially exact registration with their corresponding holes. At that instant of time, component 70 is no longer supported by board 55 and accordingly drops down by its weight and that of elements 58 and 64-67 to bring its casing into contact with the board and to produce full insertion of its leads 75 into the holes 57 in pattern 56. After such insertion takes place, the compliance of wrist 64 minimizes the chance that an inserted lead will be broken off by the continuing vibrating motion. The downward shift in the position of component 70 coincides with downward movement of slide 58 in an amount producing closure of microswitch 59 and the generation on microswitch lead 59a of a signal causing the manipulator 60 under program control to move hand 65 away from board 55 and to prepare itself for picking up another component.

That same signal is effective before such movement takes place to cause jaws 67 to release component 70 so that it will remain on board 70 when hand 65 is moved away from the board. If such signal is not generated within a predetermined time period after leads 75 have been positioned by manipulator unit 60 to contact board 55, the data processor of the manipulator unit detects that the attempt to insert such leads into holes 57 has been a failure. The manipulator unit accordingly operates to retract slide 58 back into arm 61 with component 70 still being held by jaws 67, to then deposit such component in a junk bin, and, thereafter, to pick up a new component 70 and repeat the cycle of steps described to the end of inserting the leads of the new component 70 into holes 57.

Motors 30 and 40 normally run continuously with provision being made for mounting successive boards 55 on table 25 while it is vibrating.

The vibratory motions of tables 20 and 25 are conveniently constant in frequency but may, if desired, be variable in frequency. Moreover, while it is convenient for such vibrating motions to be simple harmonic motions, they may have waveforms of more complex shape than the sinusoidal waveform characterizing simple harmonic motion. The described motion transmitting means for imparting vibratory motions to the tables 20 and 25 will necessarily cause such motions to be constant in amplitude but, if desired and by using motive means of different design than that disclosed herein, either one or both of such motions may be variable in amplitude.

The resilience of springs 36 and 46 may be selected to produce mechanical resonances at or near the frequencies of the vibratory motions of table 20 and 25 of the mass-resilience systems including by these tables and associated springs. If desired, springs 36 and 46 may of a type in which the resilience is adjustable to permit adjustment of the frequency at which such resonances occur to, thereby keep such resonant frequencies in step with any adjustment in the frequencies of the vibratory motions of the mentioned tables.

From the above description of the method of operation of apparatus 10, the method of apparatus 80, being very similar, should be self-evident. In apparatus 80, block 87 and the assembly attached thereto may be raised up and down by device 85 to facilitate placing and removal by conveyor means of successive boards 145 on, and then from, table 132. As table 132 and board 145 undergo concurrent X and Y vibratory motions, hand 155 may advantageously be operated to undergo angular vibratory motion about the axis of wrist 154, such angular vibratory motion being communicated to the component 160 held by fingers 157 so as to correct in the lead insertion process for angular misalignment in the registration between the pattern of leads 161 and the pattern of holes 162. Relative angular motion of such kind between the leads and board can also be employed for the same purpose in the operation of the FIG. 1 embodiment by angularly vibrating the wrist 64.

Having discussed generally the methods hereof for inserting leads of components into holes in printed wiring boards, some aspects of those methods will now be considered in further detail.

Figure 4:
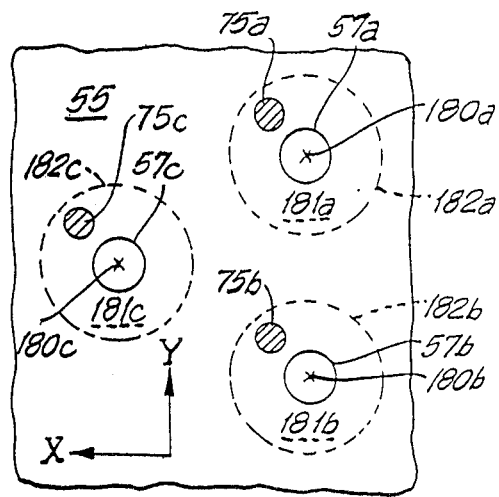
FIGS. 4–8 are diagrams illustrative of aspects of methods realized by the mentioned embodiments.

FIG. 4 shows a pattern of board 55 having formed in that portion the holes 57a, 57b and 57c of the pattern 56 of holes on the board. Points 180a, 180b and 180c are points in space positioned in the X-Y directions relative to the reference datum provided by base 11 to occupy respective locations calculated as being these of the centers of holes 180a, 180b and 180c. For convenience, it will be assumed that such centers are at those points although in practice there may be some discrepancy therebetween due to inherent limitations on the accuracy with which board 55 may set to a reference X-Y position therefor relative to base 11.

Points 180a, 180b and 180c and their corresponding holes are centrally included within respective nominal registration areas 181a, 181b and 181c the outlines of which are indicated by dash lines 182a, 182b and 182c. Areas 181 are fixed in position relative to points 180, and they represent the calculated areas in which, within an acceptable statistical error, the entire free ends (not just the centers) of leads 75a, 75b, 75c, corresponding respectively to holes 57a, 57b, 57c, will be positioned when, as described, such leads are brought, as depicted in FIG. 4, into pressure contact with board 55 and into nominal registration with such holes. While areas 181 are shown as being circular, they may be of other shapes determined as a function of the factors giving use to inaccuracies in the initial positioning of the leads relative to the holes. Among such factors are inherent limitation in (a) the X and Y accuracy with which the jaws 67 (FIG. 1) of robot arm 60 may be positioned relative to reference datum 11, (b) the X and Y accuracy with which the casing 72 of component 70 (FIG. 1) may be positioned relative to such jaws, and (c) the X and Y accuracy with which semiconductor device 71 and its leads 75 may be positioned relative to casing 72 in the course of encapsulating the device in the casing. The size of areas 181 is determined by weighting against each other the considerations that (1) the larger such areas the less likely the statistically random occurence of the leads 75 being positioned outside these areas when there is nominal registration between these leads and holes but, on the other hand, (2) the smaller such areas the faster the leads can be inserted into the holes by vibration of board 55. Thus, the size of areas 181 is preferably selected to provide an optimum compromise between these two considerations. A limitation on such areas is that they should not be of such size and shape that one or more of them includes two of holes 57 in the same area.

Figure 5:
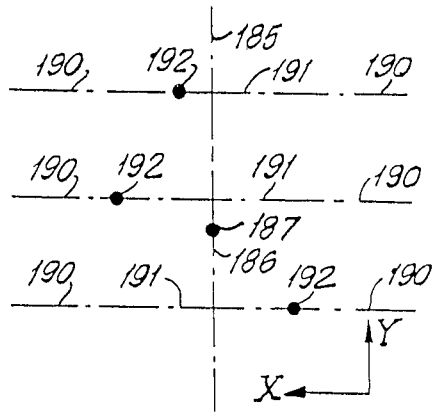

FIG. 5 is a diagram of the vibratory motion involved in the practice of the lead insertion method of FIG. 1 described herein. In FIG. 5, the path followed by table 20 in undergoing its Y vibratory motion relative to base 11 is represented by dash line 185. Path 185 is fixedly positioned in the X and Y directions relative to reference datum 11, is fixedly in alignment with the Y direction, and coincides with the centerline 186 of table 20. As that table undergoes its said vibratory motion, its center 187 oscillates back and forth in the length of path 185.

The path followed by table 25 in undergoing its X vibratory motion relative to base 14 is represented by dash line 190. Path 190 is fixedly in alignment with the X direction and coincides with the centerline 191 of table 25 and, as that table undergoes its X vibratory motion in path 190, the center 192 of the table oscillates back and forth in the length of path 190. Because, however, table 25 is mounted on table 20 which is underegoing Y vibratory motion concurrently with the X motion of table 25, path 190 is not translationally fixed in position in the Y direction relative to datum 11. Instead, the Y vibratory motion of table 20 produces, as shown in FIG. 5, a cyclical shifting back and forth in the Y direction of the position of path 190 relative to base 11. In other words, the X vibratory motion of table 25 in path 190 relative to base 11 is superposed on the Y vibratory motion of table 20 in path 185 relative to base 11 so that, with respect to the reference datum provided by that base, table 25 and the board 55 thereon undergo vibratory displacements in both the X direction and the Y direction so as to move in both these directions relative to the leads 75 in contact therewith.

While the relative vibratory movements between the board and these leads have so far been described in terms of the board moving and the leads being stationary, such relative movements will, from now, and on for easier understanding, be described in terms of the board being stationary and the leads as moving over such board.

Figure 6:
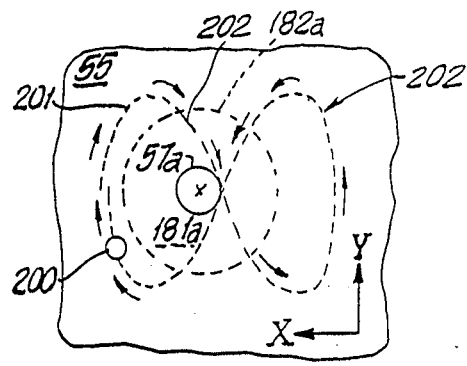

The effect of the superposition of the described Y and X vibratory motions causes, lead 75a, for example, to sweep in a two dimensional pattern over the nominal registration area 181a on board 55 and centrally including hole 57a. All the other leads 75 move of course, in similar patterns over their corresponding registration areas 181. An exemplary one of such patterns, involving lead 75a and hole 57a, is depicted in FIG. 6 by the illustrated movement of a spot 200 in a complex two-loop path 201 of which the centerline is represented by dash line 202. Spot 200 is concentric with the cross-section of the free end of lead 75a but, for reasons later described, is considered as having a diameter equal to the difference between the diameters of lead 75a and hole 57a. The pattern 202 traced out by path 201 will be recognized as being as a Lissajou figure pattern which, however, is not a closed or static pattern in which the beginning and ends of path 201 meet in one tracing of the two loops but, rather, is an open or dynamic pattern in which the end of path 201 is shifted from its beginning in the course of fully tracing a single out-and-back movement of spot 200. Pattern 202 is one which will be produced when the frequency of the Y vibratory motion is about twice that of the X vibratory motion but not an integral multiple of the X vibratory frequency. Under those conditions, the out-and-back pattern 202 produced in each two cycles of the Y vibratory motion will change in position and/or shape on board 55 relative to the previously produced out-and-back pattern 202 until, after the Y vibratory motion has gone through an appropriate number of cycles, the next produced out-and-back pattern 202 will reiterate in shape, size and positioning the pattern shown in FIG. 6. With lead 75 sweeping over board 55 in the course of tracing out that overall dynamic Lissajou figure pattern (comprising a succession of such changing out-and-back patterns), the center of lead 75a eventually becomes positioned close enough to the center of hole 57a that the lead readily inserts, under the pressure thereon, into the hole, the lead being within the cross-section of the hole. In such connection, the registration needed between the lead and the hole to produce insertion of the lead need not be exact in the sense of the whole cross-section of the lead being within the cross-section of the hole. Instead it suffices for insertion if the registration is substantially exact in the sense that enough of the cross-section of the lead is within that of the hole for the pressure on the lead to produce insertion thereof.

Evidently, the events described above by which lead 75a inserts into hole 57a is duplicated by concurrently corresponding events occurring for all other of leads 75 and by which they too all become inserted in their corresponding holes 57 in pattern 56 on board 55.

Figure 7:
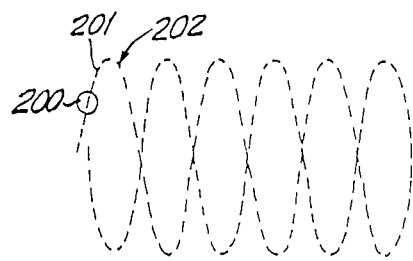

The patterns generated by the sweeping of the leads over the board may take a variety of forms consistent with successful insertion of the leads into their corresponding holes. For example, as shown on FIG. 7, the out-and-back patterns swept out by the leads may have a much larger number of loops then the FIG. 6 pattern. Such FIG. 7 pattern is produced when the frequency of the X vibratory motion is much larger than that of the Y vibratory motion. As another example, the pattern may change in shape as in the case where the X vibratory motion differs from the Y vibratory motion by a changing phase causing the out-and-back patterns to change in shape, say, from a circle to a straight line to a circle to a second straight line (at right angles to the first) and then back to a circle to repeat such cycle of changes.

Some desirable criteria for the patterns generated by the sweeping of the leads over the board will now be discussed.

To better assure that, at some time in the generation of the overall pattern, the leads will come into substantially exact registration with the holes, the amplitudes of the X and Y vibratory motions preferably are great enough for the areas covered by the patterns swept out by the leads to always completely contain within them the corresponding nominal registration areas discussed in connection with FIG. 4. On the other hand, such pattern covered areas should not be so large that one or more of them includes two holes 57.

Figure 8:
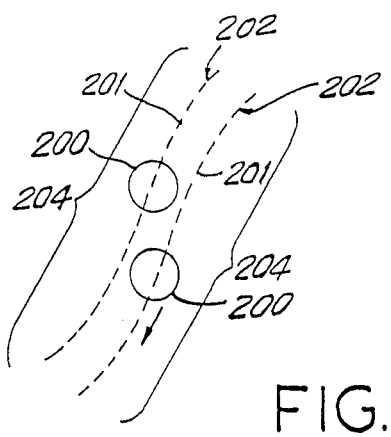

Further for realizing such better assurance, the overall patterns generated, whether static or dynamic, preferably are of such character that the leads assume every position within their nominal registration areas at which such leads could possibly be in substantially exact registration with their corresponding holes. This criterion is ideally satisfied if, as shown in FIG. 8, the centerlines 202 of all adjacent lengths 204 of the complex paths 201 traced out within the nominal registration area in the course of generating the overall pattern are centerlines separated from each other by at most the diameter of spot 200. As stated, that diameter is equal to the difference between the diameter of the leads and that of the holes. Thus, considering the width of path 202 to be equal to the diameter of spot 200, such adjacent path lengths should ideally be contiguous or overlapping. In practice, however, the closeness of spacing of these adjacent pathlengths may be somewhat coarser since, as discussed, only substantially exact registration between the leads and the holes is needed for lead insertion to take place.

The fact that the X and Y vibratory motions are each controlled in frequency and amplitude facilitates the realization of the two criteria above mentioned since such control makes more predictable the coverage on the board of the patterns generated by the leads than if such motions or either of them were random in frequency or amplitude.

It is more difficult with a static Lissajou figure pattern (i.e., one which always reiterates itself in shape, size and position in one out-and-back cycle thereof) than a dynamic Lissajou figure pattern to meet the criterion to which FIG. 8 relates. Accordingly, dynamic patterns are preferred although, in appropriate circumstances, static patterns are also usable.

The respective frequencies of the X and Y vibratory motions should each be low enough to give the leads sufficient pause time to become inserted into the holes upon being brought into substantially exact registration with the holes. While there is no lower physically imposed limit on such frequencies, they preferably should each be high enough that, once the leads have been positioned to contact the board, the time therafter required for inserting of the leads into the holes is relatively small so as to be costwise efficient. To meet such objectives, it has been concluded that the preferred range for such frequencies is between 100 cycles per minute and 1000 cycles per minute.

We have found in practice, and by way of example only, that, with exemplary diameters of the leads and of the holes being, respectively, 0.030 inch and 0.045 inch, with the linear extents in both the X and Y directions of the nominal registration areas being 0.080 inch (i.e., ±0.040 inch,) and with the frequencies of the X and Y vibratory motions being, respectively, 600 cycles per minute and 585 cycles per minute, the time required for insertion for the leads can be reduced to be, in almost all cases less than 0.5 second.

The above described methods and apparatus being exemplary only, it is to be understood that additions thereto, omissions therefrom and modifications thereof can be made without departing from the spirit of the invention. Some examples of what has just been stated are, without limitation, as follows.

The invention is, unless otherwise indicated by the context, applicable where only one lead need be inserted in a hole. Further, it is applicable where the hole is in a substrate other than a printed wiring board. As earlier mentioned, the term "lead" includes in its meaning an elongated elements other than an electrical lead, and the invention is applicable where the one or more leads are unattached to anything or, alternatively, where the one or more leads are attached to something other than an electric circuit component. The apparatus invention hereof can be practiced with the use of lead positioning means which is other than program-controlled robotic manipulator means, and the same is true for the method invention hereof but, even more broadly, in that the human hand can be used to directly or indirectly hold the one or more leads adjacent to the substrate to be in contact therewith under pressure and in nominal registration with the one or more corresponding holes in the substrate. While the disclosed embodiments have separate motors for producing the X and Y vibratory motions, in lieu of such two motors, there may be used a single motor driving two separate motion transmitting means which respectively produce the X and Y vibratory motion and which differ from each other so that such two motions differ in frequency. Further, instead of having the relative translational vibration between the one or more leads and the substrate produced by holding such one or more leads positionally fixed relative to a stationary reference datum and relatively moving the substrate in respect of that datum, insertion of the one or more leads may also be effected according to the invention by producing such relative translational vibration by movement of the one or more leads relative to that datum, and by maintaining the substrate positionally fixed relative thereto.

As another point, advantages in the use of a pressure greater than the weight of the multilead component for insertion purposes are that such greater pressure assures full insertion of the leads into the substrates and facilitates insertion of the leads where bent so as to tend to bind in the holes.

Accordingly, the invention is not to be considered as limited save as is consonant with the recitals of the following claims.

What is claimed is:

1. A method for inserting a plurality of leads in a pattern into a corresponding plurality of holes formed in a substrate to extend therethrough from a surface thereof and arranged on said surface in a pattern corresponding in size and shape to said lead pattern, said method comprising, holding said leads adjacent said surface to be in contact therewith under pressure for a time period and to be in nominal registration with their respective holes, relatively moving in translation for said period said leads and substrate in two dimensions in the plane of said substrate to produce between said leads and substrate a relative translational vibration in said plane productive of a sweeping for said period of said leads while in said pressure contact with said surface, in two dimensional patterns over areas of said surface centrally including said holes until at the end of said period said leads register substantially exactly with said holes to thereupon be entered therein by said pressure, and, concurrently with said translational vibration, relatively moving angularly said pattern of leads and said substrate to produce between such lead and hole patterns a relative angular vibration superposed with said translational vibration and adapted to correct for any angular misregistration between said lead pattern and said hole pattern.

2. Apparatus for inserting leads arranged in a pattern into holes formed in a corresponding pattern in substrate and extending through such substrate from a surface thereof, said apparatus comprising: base means for apparatus, carriage means supported by said base means for mounting said substrate, lead positioning means coupled to said base means and operable while holding said leads to position them in said pattern in contact under pressure with said substrate for a time period and in nominal registration for said period with said holes, means to produce relative translational vibration for said period between (a) said positioning means and (b) said carriage means and the substrate thereon to produce a sweeping for said period of said leads while in pressure contact with said surface over areas thereof centrally including said holes and by such sweeping, to effect at the end of said period a substantially exact registration between said leads and holes and consequent insertion of said leads into said holes under said pressure, and means in a coupled relation with both said carriage means and lead positioning means and interposed in such relation between them to produce concurrently with said relative translational vibration a relative angular vibration between (c) said lead positioning means and said pattern of leads held thereby and (d) said carriage means and substrate with said pattern of holes therein so as to correct in the course of said translational vibration for angular misregistration between said pattern of leads and the corresponding pattern of said holes.

* * * * *